United States Patent [19]
Yahano

[11] Patent Number: 4,502,205
[45] Date of Patent: Mar. 5, 1985

[54] METHOD OF MANUFACTURING AN MIS TYPE SEMICONDUCTOR DEVICE

[75] Inventor: Toshi Yahano, Yokohama, Japan
[73] Assignee: Fujitsu Limited, Kawasaki, Japan
[21] Appl. No.: 505,976
[22] Filed: Jun. 20, 1983
[30] Foreign Application Priority Data Jun. 23, 1982 [JP] Japan .................. 57-108003

[51] Int. Cl.³ .......................... H01L 21/265
[52] U.S. Cl. .................. 29/576 B; 29/571; 148/1.5; 357/91
[58] Field of Search ......... 29/576 B, 571; 148/1.5; 250/492.2; 357/91

[56] References Cited
U.S. PATENT DOCUMENTS 4,116,717 9/1978 Rahilly .................. 136/255
4,331,485 5/1982 Gat ....................... 148/1.5

FOREIGN PATENT DOCUMENTS 54-106180 8/1979 Japan ..................... 29/576 B
55-107229 8/1980 Japan ..................... 29/576 B

OTHER PUBLICATIONS

P. Siffert, in Proceedings, 4th European Community Photovoltaic Solar Energy Conf., Stresa, Italy, May 1982, Reidel Pub. Co., pp. 901-918.

Primary Examiner—Aaron Weisstuch
Attorney, Agent, or Firm—Staas & Halsey

[57] ABSTRACT

A method of forming an impurity region for an MIS type semiconductor device includes the step of activating an implanted impurity with an energy beam anneal, said implantation comprising multiple impurity ion implantation steps with varied implantation energies. The implantation energy and dosage are selected to provide a total peak concentration of implantation profile which does not exceed the electrically active solubility. The energy beam anneal is performed in such a way that the implanted impurity is substantially activated without redistribution. An impurity region with low sheet resistance is obtained, lateral diffusion of the impurity is suppressed, and the leakage current is kept low.

14 Claims, 9 Drawing Figures

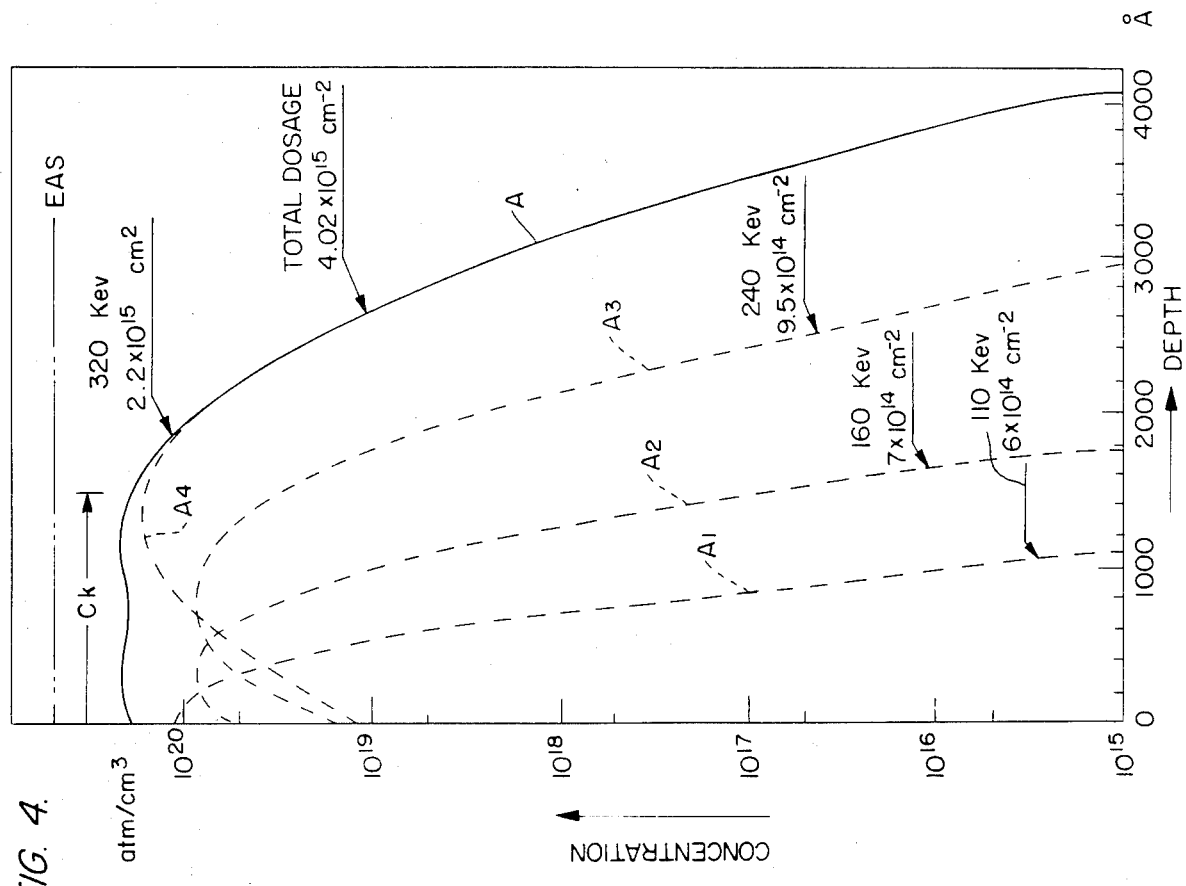
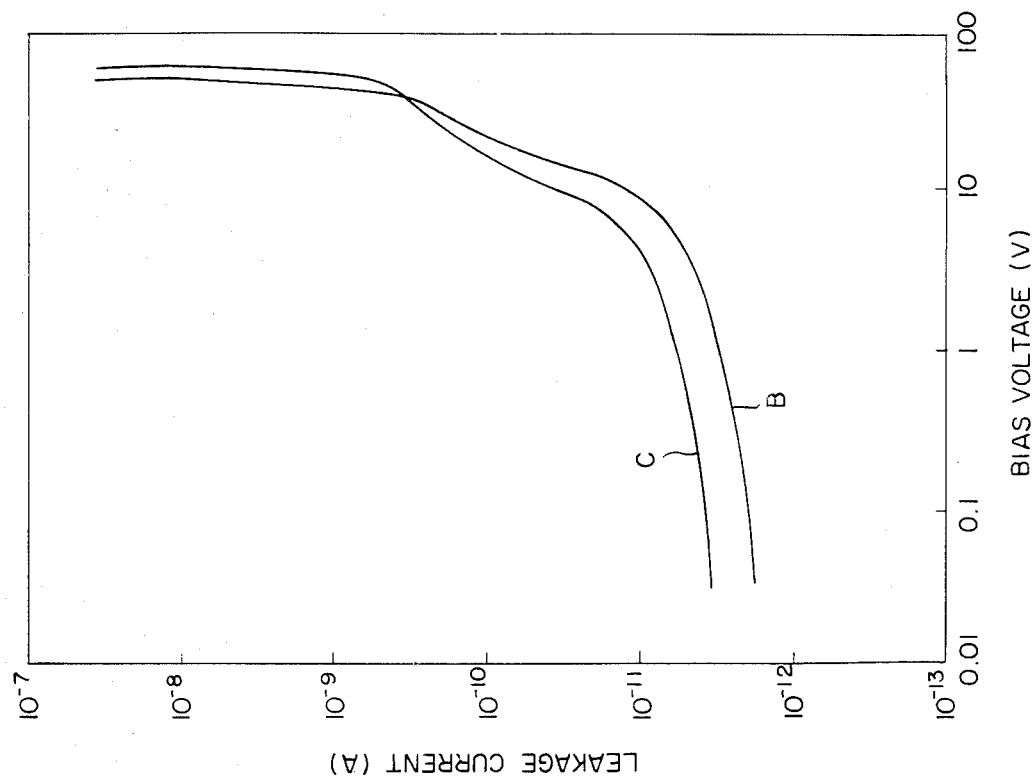

METHOD OF MANUFACTURING AN MIS TYPE SEMICONDUCTOR DEVICE

BACKGROUND OF THE INVENTION (1) Field of the Invention

This invention relates to a method of manufacturing an MIS (Metal-Insulator-Semiconductor) type semiconductor device and more specifically to a method of forming an impurity region for an MIS type device in a semiconductor substrate using an ion implantation method.

(2) Description of the Prior Art

With progress in miniaturization of elements for realizing high integration density of a semiconductor device, ion implantation has been used extensively as a means for accurately forming an impurity region having a desired impurity concentration profile.

The ion implantation method has diversified merits as compared with the thermal diffusion method. For example, fluctuation of sheet resistance of the implantation layer can be reduced, impurity concentration can be increased, processing can be executed at a comparatively low temperature and within a short period of time, junction depth can be controlled with excellent accuracy, a complicated impurity profile can be formed rather easily, and pattern accuracy can be improved.

It has been found that the solid solubility at which an impurity becomes active electrically in a semiconductor material lies at a point lower than the metallurgical solid solubility at which the impurity is capable of being dissolved into the semiconductor material under the thermal equilibrium state, when the impurity is implanted into a semiconductor base material. This solid solubility is called an electrically active solubility, and it is about, for example, $2 \sim 6 \times 10^{20}$ atm/cm$^3$ when arsenic (As) is implanted as an impurity into silicon (Si). When impurity atoms exceeding the electrically active solubility exist in the impurity region, such excessive impurity atoms become carrier traps or lower the mobility of carriers, thereby increasing the sheet resistance of the impurity introduced region or the leakage current, and accordingly degrading peformance of the completed semiconductor elements. An MIS type semiconductor device, particularly an MIS IC, is designed in many cases so that the impurity region functions as wiring. Therefore, it is often desirable to keep the sheet resistance of the impurity region as low as possible even if this requires increasing integration density.

Conventionally, when forming the n-channel type MIS-IC, etc., by the ion implantation method with As used as the impurity, as shown in FIG. 1(a), a gate oxide film 4 is formed at a thickness of about 500 Å on a surface portion of a p-type Si substrate 3 having an impurity concentration of about $10^{15}$ atm/cm$^3$. The gate oxide film 4 is exposed and surrounded by a field isolation oxide film 1 and a p$^+$-type channel stopper region 2. A polycrystalline Si gate electrode 5 is formed on the gate oxide film 4 to a thickness of about 3000~4000 Å; thereafter arsenic ions (As$^+$ are implanted with a dosage of about $4 \times 10^{15}$ atm/cm$^2$ at an energy in the range of 100~150 KeV, for example 120 KeV, to the surface of the p-type Si substrate 3 through the gate oxide film 4 with the gate electrode 5 used as the mask (where 6' is the As$^+$ implanting region).

FIG. 2 is a graph of an As concentration profile of the As implanting region thus formed. In this figure, the curve shows the concentration of As vs. depth, S is metallurgical solid solubility at 1100° C., EAS is electrically active solubility, SiO$_2$ denotes a gate oxide film region, and Si denotes a p-type Si substrate region.

In the existing method, As is implanted in such amount as is required to obtain the desired low sheet resistance, without particular consideration of the resulting electrically active solubility. Therefore, as shown in FIG. 2, the concentration of As at the peak value is larger than the electrically active solubility. However, in the existing method, As is redistributed by a thermal treatment in succeeding process steps and, as a result, the peak value of the concentration of As is lowered.

The substrate is then heated by an electric furnace for about 30 min at a temperature as high as about 1000° C. in a nitrogen (N$_2$) ambient and is annealed to activate the As$^+$ implanted region 5. As explained above, As is redistributed in this process. FIG. 1(b) ia a cross-sectional view illustrating the condition after such annealing. In this figure, 6 is the As diffused region (n+-type source/drain region) formed by annealing the As implanting region. As shown in the figure, the implanted As is diffused by the annealing process, so that the As diffused region (source/drain region) 6 is formed to a depth (d) of about 4000 Å. This As diffused region expands laterally by the dimension l (which is almost tantamount to the depth) from the mask end 7 (l is about 3000 Å). For this reason, the existing method has a problem in that the lateral diffusion interferes with high integration density of elements.

Moreover, the high temperature-heated annealing method has been accompanied by the problem that the lateral diffusion changes in dimension because the concentration profile of As in the diffused region cannot be controlled strictly, and element characteristics fluctuate due to the change in the length of the channel of the MIS type transistor.

An example of a method which has been attempted in order to alleviate the above problems is the shallow formation of a diffused region. In this case, however, the total amount of As in the diffused region runs short and accordingly the desired low sheet resistance value cannot be obtained. Another example of a method which has been conducted is where the ion-implanted impurity is irradiated with an energy beam and is activated without any substantial redistribution of impurity. When redistribution of the impurity does not occur, the impurity does not expand laterally during the annealing process. However, an impurity implanted in such a concentration as to exceed the electrically active solubility is not activated because it is never reduced to a concentration lower than the electrically active solubility by redistribution. Nevertheless, if the ion implantation method is used, such a large amount of impurity must be implanted that the peak concentration exceeds the electrically active solubility, in order to obtain the low sheet resistance which is usually desired in an MIS type semiconductor device.

SUMMARY OF THE INVENTION

A primary object of the present invention is to provide a method of forming an impurity region for a MIS type device having a desired low sheet resistance, without causing lateral diffusion of the impurity.

Another object of the present invention is to prevent any adverse effects on the characteristics of the MIS type device caused by impurity concentrations exceeding the electrically active solubility.

According to the present invention, a method of manufacturing an MIS type semiconductor device having an impurity region formed in a semiconductor device is provided, comprising the steps of: implanting ions of an impurity into the semiconductor substrate with a plurality of varied implantation energies and with an implantation dosage to form the impurity region, the energies and the dosage being selected to provide an impurity distribution in the region having a peak concentration which does not exceed the electrically active solubility of the impurity; and irradiating the impurity region with an energy beam to render the implanted impurity in the region electrically active without any substantial redistribution of the impurity.

In one embodiment of the present invention, where the substrate is composed of silicon, the impurity is arsenic, and the electrically active solubility is $6 \times 10^{20}$ atm/cm$^3$, a light beam emitted from a xenon lamp, a laser beam or an electron beam can be used as the energy beam.

BRIEF DESCRIPTION OF THE DRAWINGS

FIG. 4 is a graph of the concentration profile for arsenic obtained by ion implantation of arsenic in accordance with the preferred embodiment of the present invention; and FIG. 5 is a graph indicating the leakage curent characteristic of a PN junction formed by the arsenic ion implantation process of the present invention.

DESCRIPTION OF THE PREFERRED EMBODIMENT

A preferred embodiment of the present invention will be explained in detail by referring to the cross-sectional view of a substrate during the manufacturing process as shown in FIGS. 3(a) through 3(d), and to the arsenic (As) concentration profile (FIG. 4) of an As implanted region of the same embodiment.

Figure 1A:
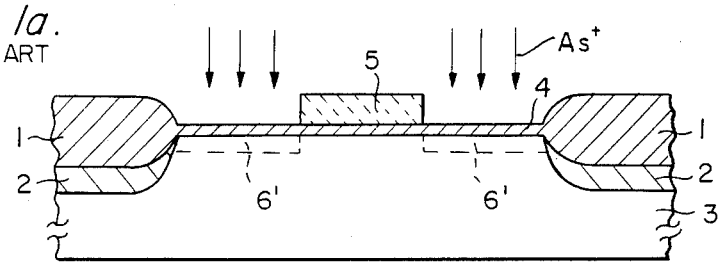
FIGS. 1(a) and 1(b) are cross-sectional views of a semiconductor substrate during the manufacturing process for an MIS type semiconductor device according to the prior art.
Figure 1B:
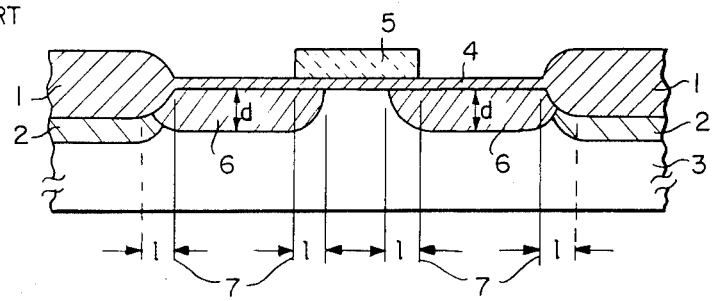
Figure 2:
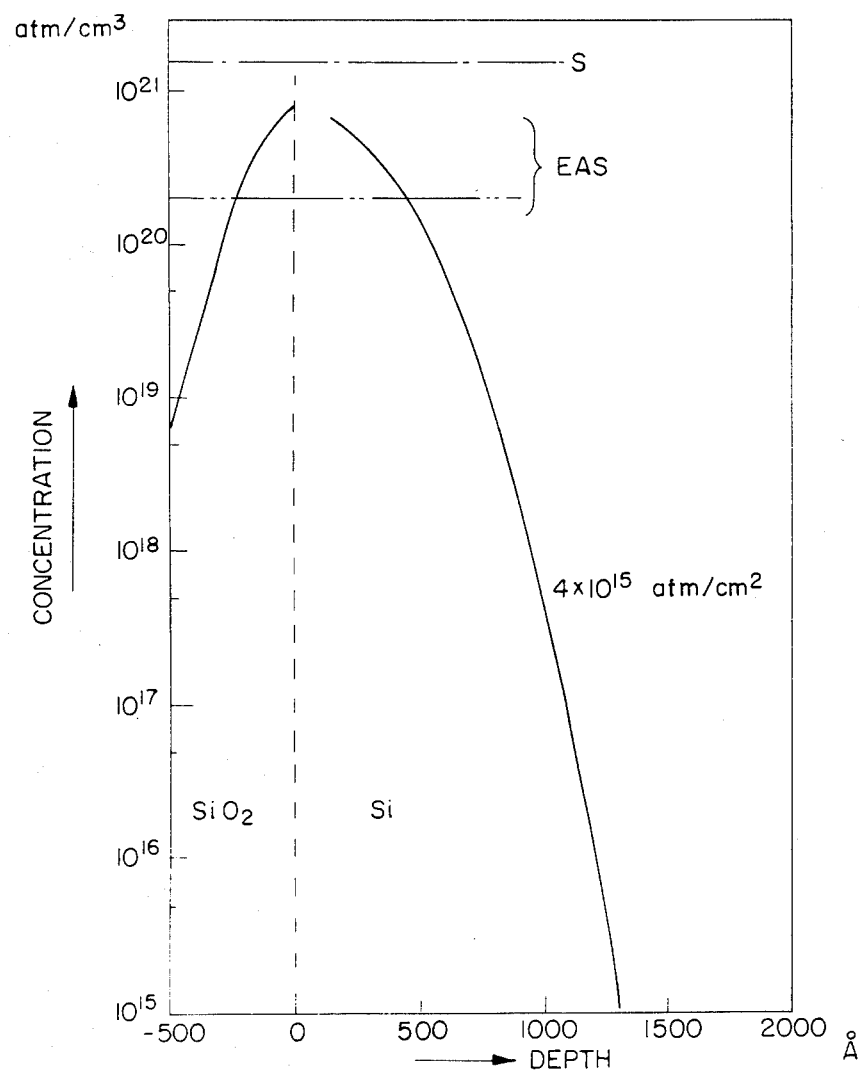
FIG. 2 is a graph indicating a prior art concentration profile for arsenic obtained by implanting arsenic ions.
Figure 3A:
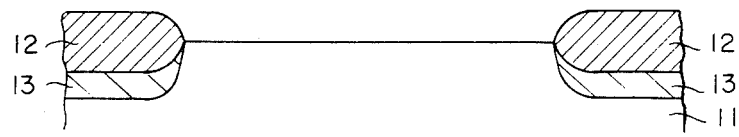
FIGS. 3(a) through 3(d) are cross-sectional views of a semiconductor substrate during the manufacturing process for the MIS type semiconductor device according to the preferred embodiment of the present invention.

When forming, for example, an n-channel MIS-IC by the method of the present invention, as shown in FIG. 3(a), a substrate is prepared by a conventional method, wherein a field isolation oxide film 12 and a p+-type channel stopper region 13 are formed on a surface of a p-type silicon (Si) substrate 11, with an impurity concentration of about $10^{15}$ atm/cm$^3$.

Figure 3B:
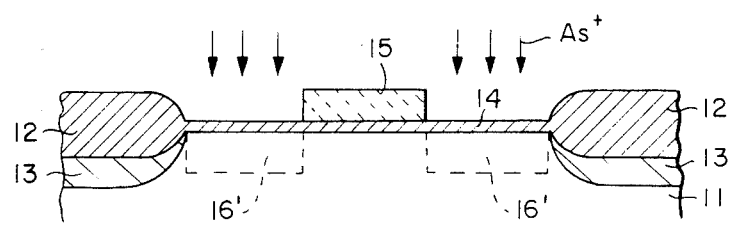

Then, as shown in FIG. 3(b), a gate oxide film 14 is formed to a thickness, for example, of about 500 Å on the exposed surface of the p-type Si substrate 11 by an ordinary thermal oxidation method, and a polycrystalline Si gate electrode 15 is formed on the gate oxide film 14 by an ordinary chemical vapor deposition or patterning process.

In the method of the present invention, in order to form an arsenic (As) implanted region having a low sheet resistance, such as about 20~30 ohm-square, which is almost the same as that of a region formed by the annealing method using an electric furnace, the As ion implantations are sequentially carried out under the following four kinds of conditions: (1) implantation energy of 110 KeV and dosage of $6 \times 10^{14}$ atm/cm$^2$; (2) implantation energy of 160 KeV and dosage of $7 \times 10^{14}$ atm/cm$^2$; (3) implantation energy of 240 KeV and dosage of $9.5 \times 10^{14}$ atm/cm$^2$; and (4) implantation energy of 320 KeV and dosage of $2.2 \times 10^{15}$ atm/cm$^2$. By using this process, an impurity-implanted region can be formed, wherein the peak concentration of the implanted As profile does not exceed the electrically active solubility of $6 \times 10^{20}$ atm/cm$^3$.

In this implanting process, the field isolation oxide film 12 and the polycrystalline Si gate electrode 15 function as the implantation mask, and the arsenic (As) is implanted in the surface of p-type Si substrate 11 through the gate oxide film 14 (where 16' is the As$^+$-implanted region).

Referring to FIG. 4, solid curve A indicates the profile of the total concentration of As in the p-type Si substrate 11 to which the As is implanted in multiple steps under the four kinds of implantation conditions. In the same figure, the vertical axis indicates the concentration of As, while the horizontal axis indicates the depth from the Si substrate surface. The dotted line curves $A_1$ through $A_4$ respectively indicate the concentration profile of As individually implanted under the respective conditions.

As is apparent from FIG. 4, the condition of the multiple implantation is preset so that the As concentration profile after multiple implantation does not exceed the electrically active solubility (EAS) in silicon at the peak value, since the EAS of As is about $2.5 \times 10^{20}$ atm/cm$^3$. Moreover, it is desirable to preset the implantation condition so that the region Ck near the peak value of the concentration of As is kept as deep as possible. In addition, as explained above, since a p-type Si substrate having an impurity concentration of about $10^{15}$ atm/cm$^3$ is used, the junction depth is almost 4000 Å.

Figure 3C:
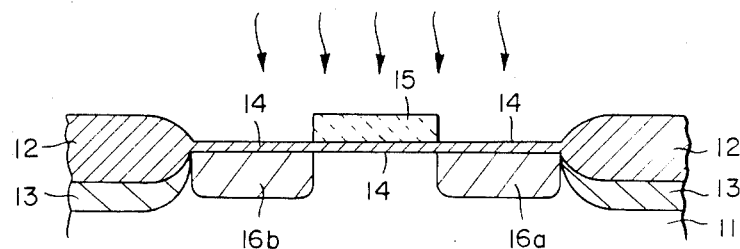
Figure 3D:
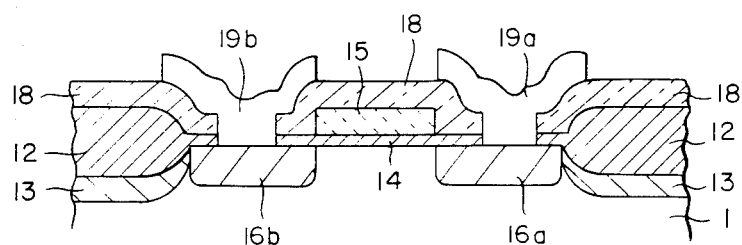

After the implantation steps, a light beam having an intensity of 26 J/cm$^2$ is irradiated for a short period of about 400 µs onto the As$^+$-implanted region under the condition that the substrate is preheated, for example, up to 450° to 550° C. by a heater in an underlying substrate holder, so that the implanted As is activated without any substantial redistribution. As the light source, a xenon flash lamp, etc., may be used. By the activation process, As-implanted regions 16a and 16b, at a depth of about 4000 Å for N$^+$-type source/drain regions are formed as shown in FIG. 3(c).

The sheet resistance of the As-implanted regions 16a and 16b processed by the light irradiation annealing is as low as 20~30 ohms, substantially the same as the value obtained by the existing high temperature annealing method. Moreover, since the As is not redistributed during the light irradiation annealing process, the thus formed impurity region does not expand in the lateral direction from the edge of mask 17. Therefore, diffusion of impurity in the lateral direction from the mask edge in the present invention is kept within 0.1 µm which is inevitably introduced by the implantation of As$^+$.

FIG. 5 is the leakage current characteristic of the PN junction between the N$^+$-type region thus formed and the p-type substrate under the reverse bias. The horizontal axis indicates bias voltage, while the vertical axis indicates the leakage current, and curve B shows the characteristic of the PN junction formed in this embodiment. The curve C shows the characteristic of a PN junction formed for comparison.

This sample for comparison has been formed by a single As ion implantation with implantation energy of 200 KeV and dosage of $1\times10^{16}$ atm/cm$^3$. The substrate used, annealing, and other conditions are the same as those for the embodiment of the invention. The resultant sheet resistance of the As-implanted region is about 30 ohms and this is almost the same as that of the embodiment. However, as illustrated by the above comparison, the leakage current is about double compared to the embodiment. Thus, the As region formed by the method of the above embodiment of the present invention has a much improved leakage current characteristic.

As shown in FIG. 3($d$), after the As-implanted regions are formed, the insulating layer 18 is formed on the substrate by a conventional method, an electrode window is formed in the insulating film and the source/-drain wirings 19$a$, 19$b$ are formed, thus completing an n-channel MIS-IC.

In the above embodiment, a dosage of As$^+$ is adjusted to a value near its electrically active solubility in order to lower the sheet resistance as much as possible, but when a higher sheet resistance is acceptable, the total dosage is naturally selected to be lower.

The present invention has been explained with reference to the source/drain regions in the above embodiment, but the method of this invention can also be applied to form wiring regions, such as bit wiring consisting of an impurity introduced region substrate as well.

Phosphorous (P) and boron (B), in addition to As, can be used as the impurity to be implanted. In addition, the energy beam used to anneal for activation, can be any energy beam (e.g., a laser beam, an electron beam, etc.) which is capable of instantly heating the substrate by irradiation.

As explained above, according to the method of the present invention, when forming an impurity region having a low sheet resistance by using an ion implantation method, lateral diffusion of the impurity region and fluctuation in the size of the region are minimized. Therefore, the method of this invention is very effective for achieving high integration density and equalization of characteristics in a semiconductor device.

I claim:

1. A method of manufacturing an MIS type semiconductor device having impurity containing regions formed in a semiconductor substrate, comprising the steps of:
   (a) implanting ions of the impurity into the semiconductor substrate at a plurality of implantation energies and with an implantation dosage to form the impurity containing regions, the implantation energies and the implantation dosage being selected to provide an impurity distribution for the impurity containing regions having a peak concentration which does not exceed the electrically active solubility of the impurity; and
   (b) irradiating the impurity containing regions with an energy beam to render the implanted impurity in the region electrically active without substantially redistributing the impurity, so that source and drain regions are formed in the impurity containing regions.

2. A method as set forth in claim 1, wherein the semiconductor substrate is silicon, wherein the impurity is arsenic and wherein said step (a) includes controlling the peak concentration so that it is less than $6\times10^{20}$ atm/cm$^3$.

3. A method as set forth in claim 1, wherein said step (b) comprises irradiating the impurity containing regions with a light beam generated by a lamp.

4. A method as set forth in claim 3, wherein the lamp is a xenon lamp.

5. A method as set forth in claim 1, wherein said step (b) comprises irradiating the impurity containing regions with a laser beam.

6. A method as set forth in claim 1, wherein said step (b) comprises irradiating the impurity containing regions with an electron beam.

7. A method of manufacturing an MIS type semiconductor device having impurity containing regions formed in a semiconductor substrate, comprising the steps of:
   (a) implanting ions of the impurity into the semiconductor substrate, said step (a) comprising the substeps of:
      (i) implanting the ions of the impurity with a first implantation energy and a first dosage; and
      (ii) implanting the ions of the impurity at a second implantation energy and a second dosage, the first and second implantation energies and the first and second implantation dosages selected so that the impurity distribution for the impurity containing regions has a peak concentration which is less than the electrically active solubility of the impurity in the semiconductor substrate; and
   (b) irradiating the impurity containing regions with an energy beam to activate the implanted impurity without substantially redistributing the impurity, so that source and drain regions are formed in the impurity containing regions.

8. A method as set forth in claim 7, wherein the semiconductor substrate is silicon, wherein the impurity is arsenic, and wherein said step (a) includes controlling the peak concentration of the impurity distribution for the impurity containing regions so that it is less than $6\times10^{20}$ atm/cm$^3$.

9. A method as set forth in claim 8, wherein said step (b) comprises irradiating the impurity containing regions with an energy beam selected from the group consisting of a light beam generated by a xenon lamp, a laser beam, and an electron beam.

10. A method as set forth in claim 7, wherein said step (b) comprises irradiating the impurity containing regions with an energy beam selected from the group consisting of a light beam generated by a xenon lamp, a laser beam, and an electron beam.

11. A method of manufacturing an MIS type semiconductor device having impurity containing regions formed in a semiconductor substrate, comprising the steps of:
   (a) implanting ions of the impurity into the semiconductor substrate, said step (a) comprising the substeps of:
      (i) implanting the ions of the impurity at a first implantation energy and a first dosage;
      (ii) implanting the ions of the impurity at a second implantation energy and a second dosage;
      (iii) implanting the ions of the impurity at a third implantation energy and a third dosaage; and
      (iv) implanting the ions of the impurity at a fourth implantation energy and a fourth dosage, the first, second, third, and fourth implantation energies and the first, second, third, and fourth implantation dosages being selected so that the impurity distribution for the impurity containing regions has a peak concentration which is less than the electrically active solubility of the impurity in the semiconductor substrate; and (b) irradiating the impurity containing regions with an energy beam to activate the implanted impurity without substantially redistributing the impurity, so that source and drain regions are formed in the impurity containing regions.

12. A method as set forth in claim 11, wherein the semiconductor substrate is silicon, wherein the impurity is arsenic, and wherein said step (a) includes controlling the peak concentration of the impurity distribution for the impurity containing regions so that it is less thn $6 \times 10^{20}$ atm/cm$^3$.

13. A method as set forth in claim 12, wherein said step (b) comprises irradiating the impurity containing regions with an energy beam selected from the group consisting of a light beam generated by a xenon lamp, a laser beam, and an electron beam.

14. A method as set forth in claim 11, wherein said step (b) comprises irradiating the impurity containing regions with an energy beam selected from the group consisting of a light beam generated by a xenon lamp, a laser beam, and an electron beam.

* * * * *

UNITED STATES PATENT AND TRADEMARK OFFICE
CERTIFICATE OF CORRECTION

PATENT NO. : 4,502,205
DATED : March 5, 1985
INVENTOR(S) : YAHANO

It is certified that error appears in the above-identified patent and that said Letters Patent is hereby corrected as shown below:

Col. 2
Line 27, "1" s/b --$\ell$--;
Line 28, "(1" s/b --($\ell$--.

Col. 8
Line 2, "thn" s/b --than--.

Signed and Sealed this

Sixteenth Day of July 1985

[SEAL]

Attest:

DONALD J. QUIGG

Attesting Officer    Acting Commissioner of Patents and Trademarks